(12) United States Patent
Choi et al.

(10) Patent No.: US 10,844,512 B2
(45) Date of Patent: Nov. 24, 2020

(54) METHOD FOR MANUFACTURING SYNTHETIC GEMSTONE

(71) Applicant: Boram Holdings Co., Ltd., Seoul (KR)

(72) Inventors: Chul-Hong Choi, Seoul (KR);
Dong-Wook Shin, Seongnam-si (KR);
In-Sang Yoon, Seoul (KR); Jung-Min Kim, Seoul (KR)

( * ) Notice: Subject to any disclaimer, the term of this patent is extended or adjusted under 35 U.S.C. 154(b) by 0 days.

(21) Appl. No.: 16/518,081

(22) Filed: Jul. 22, 2019

(65) Prior Publication Data

US 2020/0131665 A1 Apr. 30, 2020

(30) Foreign Application Priority Data

Oct. 24, 2018 (KR) .................. 10-2018-0127139

(51) Int. Cl.
*C30B 11/04* (2006.01)
*C30B 13/08* (2006.01)
*C30B 29/58* (2006.01)
*A44C 17/00* (2006.01)

(52) U.S. Cl.
CPC ............ *C30B 13/08* (2013.01); *A44C 17/007* (2013.01); *C30B 29/58* (2013.01)

(58) Field of Classification Search
CPC ......... C30B 29/02; C30B 29/20; C30B 11/00; C30B 11/04
See application file for complete search history.

(56) References Cited

U.S. PATENT DOCUMENTS

| | | |
|---|---|---|
| 3,870,472 A | 3/1975 | Adamski et al. |
| 3,917,459 A | 11/1975 | Falckenberg et al. |
| 4,000,977 A | 1/1977 | Falckenberg |
| 4,062,653 A | 12/1977 | Falckenberg et al. |
| 2004/0154528 A1* | 8/2004 | Page, Jr. ............ C30B 23/00 117/84 |
| 2006/0261512 A1* | 11/2006 | Weisbrot ............ B01J 3/062 264/234 |
| 2008/0282733 A1* | 11/2008 | Tolwani ............ C12P 5/023 63/32 |

FOREIGN PATENT DOCUMENTS

| | | |
|---|---|---|
| EP | 0098724 A1 | 1/1984 |
| JP | 2000079798 A | 3/2000 |
| JP | 4394070 B2 | 1/2010 |
| JP | 2013183897 A | 9/2013 |
| JP | 2013241313 A | 12/2013 |
| JP | 5595607 B2 | 9/2014 |
| KR | 20100056724 A | 5/2010 |
| KR | 20140034599 A | 3/2014 |
| KR | 20170056235 A | 5/2017 |
| KR | 20180059214 A | 6/2018 |

OTHER PUBLICATIONS

Harris, Daniel C._Sapphire Crystal Growth_May 2004.

* cited by examiner

*Primary Examiner* — Robert M Kunemund
(74) *Attorney, Agent, or Firm* — Harness, Dickey & Pierce, P.L.C.

(57) ABSTRACT

Provided is a method for manufacturing a synthetic gemstone, which manufactures a synthetic gemstone from a body tissue separated from a person or an animal, the method including: extracting a biological material from the body tissue; preparing a mixed material by mixing the biological material with a gemstone material; and growing a synthetic gemstone on a crystal seed as a single crystal by melting the mixed material.

9 Claims, 7 Drawing Sheets

METHOD FOR MANUFACTURING SYNTHETIC GEMSTONE

CROSS-REFERENCE TO RELATED APPLICATIONS

This U.S. non-provisional patent application claims priority under 35 U.S.C. § 119 of Korean Patent Application No. 10-2018-0127139, filed on Oct. 24, 2018, the entire contents of which are hereby incorporated by reference.

BACKGROUND

The present disclosure herein relates to a method for manufacturing a synthetic gemstone. More particularly, the present disclosure herein relates to a method for manufacturing a synthetic gemstone by using a body tissue separated from a person or an animal or cremation ashes of a corpse of a person or an animal.

People have been researched various methods for remembering a deceased person or pet forever or memorizing a lover or entertainer. In case of foreign countries, a business, which extracts a biological element from a body tissue separated from a person or pet or from cremation ashes of a corpse of a person or pet and inserts the extracted biological element into a synthetic gemstone such a synthetic ruby or diamond, has been developing. In recent years, a trend of inserting the biological element into a synthetic ruby, which is relatively easy to be manufactured, has been increasing.

A technology, which extracts a biological element from a person or pet and inserts the extracted biological element into a synthetic gemstone, has been developed in only a few advanced countries. In terms of domestic situation, the above-described technology has been slowly developing.

SUMMARY

The present disclosure provides a method for manufacturing a synthetic gemstone by using a body tissue separated from a person or an animal or cremation ashes of a corpse of a person or an animal.

The present disclosure also provides a method for manufacturing a synthetic gemstone having a specific color according to characteristics and element contents of a biological material or a biological extract, which is extracted from a person or an animal.

An embodiment of the inventive concept provides a method for manufacturing a synthetic gemstone, which manufactures a synthetic gemstone from a body tissue separated from a person or an animal, the method including: extracting a biological material from the body tissue; preparing a mixed material by mixing the biological material with a gemstone material; and growing a synthetic gemstone on a crystal seed as a single crystal by melting the mixed material.

In an embodiment, the extracting of the biological material may include removing an organic material in the body tissue by combusting the body tissue.

In an embodiment, the combusting of the body tissue may include: disposing the body tissue in an ashing furnace; allowing air to flow into the ashing furnace by using an air pump; and combusting the body tissue by the ashing furnace.

In an embodiment, the extracting of the biological material may include cleaning the body tissue by using a cleaning solution.

In an embodiment of the inventive concept, a method for manufacturing a synthetic gemstone, which manufactures a synthetic gemstone from a body tissue separated from a person or an animal, includes: extracting a biological extract from the body tissue; preparing a mixed material by mixing the biological extract with a gemstone material; and growing a synthetic gemstone on a crystal seed as a single crystal by melting the mixed material.

In an embodiment, the extracting of the biological extract may further include: preparing a diluted solution by putting the biological extract into distilled water; boiling the diluted solution; and extracting the biological extract from the diluted solution.

In an embodiment, the extracting of the biological extract may include: removing sludge from the diluted solution; and evaporating moisture in the diluted solution by heating the diluted solution.

In an embodiment, the extracting of the biological extract may further include putting the gemstone material into the diluted solution before the evaporating of the moisture in the diluted solution.

In an embodiment of the inventive concept, a method for manufacturing a synthetic gemstone, which manufactures a synthetic gemstone from cremation ashes of a corpse of a person or an animal, includes: extracting a biological extract from the cremation ashes; preparing a mixed material by mixing the biological extract with a gemstone material; and forming a synthetic gemstone on a crystal seed as a single crystal by melting the mixed material.

In an embodiment, the extracting of the biological extract may further include: preparing a diluted solution by putting the cremation ashes into distilled water; boiling the diluted solution; and extracting the biological extract from the diluted solution.

In an embodiment, the extracting of the biological extract may further include: removing sludge from the diluted solution; and evaporating moisture in the diluted solution by heating the diluted solution.

In an embodiment, the extracting of the biological extract may further include putting the gemstone material into the diluted solution before the evaporating of the moisture in the diluted solution.

In an embodiment, the extracting of the biological extract may further include stirring a diluted solution by using a stirrer including a stirring bar and an electric motor configured to move the stirring bar.

In an embodiment, the preparing of the mixed material may include mixing the biological extract and the gemstone material by using a mixer.

In an embodiment, the mixing of the biological extract and the gemstone material by using the mixer may include mixing the biological extract, the gemstone material, and a ceramic ball, and the mixer may be a double shaking mixer.

In an embodiment, the growing of the synthetic gemstone as a single crystal may include: a material input step of inputting the mixed material to a material input unit; a sparking and heating step of sparking a flame by using oxygen and hydrogen and raising a temperature of an inner space of a muffle by the flame; a melting step of melting an uppermost portion of the crystal seed; an expanding step of growing a first portion of the synthetic gemstone by allowing the melted mixed material to be arrived on the crystal seed; a growing step of growing a second portion of the synthetic gemstone by allowing the melted mixed material to be arrived on the first portion; and a warming step of reducing an internal stress of the synthetic gemstone. Here, while the first portion is grown, a diameter thereof may increase, and while the second portion is grown, a diameter thereof may be maintained to be constant.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
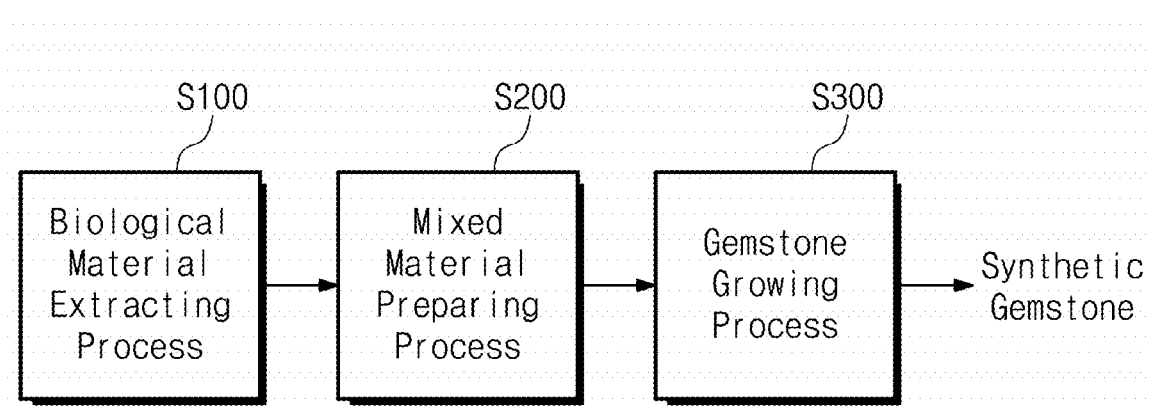
FIG. 1 is a view for explaining a schematic sequence of a method for manufacturing a synthetic gemstone according to an embodiment of the inventive concept.

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Hereinafter, exemplary embodiments of the inventive concept will be described in detail.

FIG. 1 is a view for explaining a schematic sequence of a method for manufacturing a synthetic gemstone according to an embodiment of the inventive concept.

Referring to FIG. 1, the method for manufacturing a synthetic gemstone according to an embodiment of the inventive concept may include biological extracting process S100, a mixed material preparing process S200, and a gemstone growing process S300.

In the biological extracting process S100, a biological material or a biological extract may be extracted from a body tissue separated from a person or an animal or cremation ashes of a corpse of a person or an animal. For example, the body tissue may be at least one of a hair, a nail, and a toenail separated from a person or an animal.

In the mixed material preparing process S200, a mixed material may be manufactured by mixing the biological material or the biological extract with a gemstone material. For example, the gemstone material may include at least one of aluminum oxide and silicon magnesium oxide.

The gemstone growing process S300 may grow the mixed material manufactured in the mixed material preparing process S200 into a synthetic gemstone.

Figure 2A:
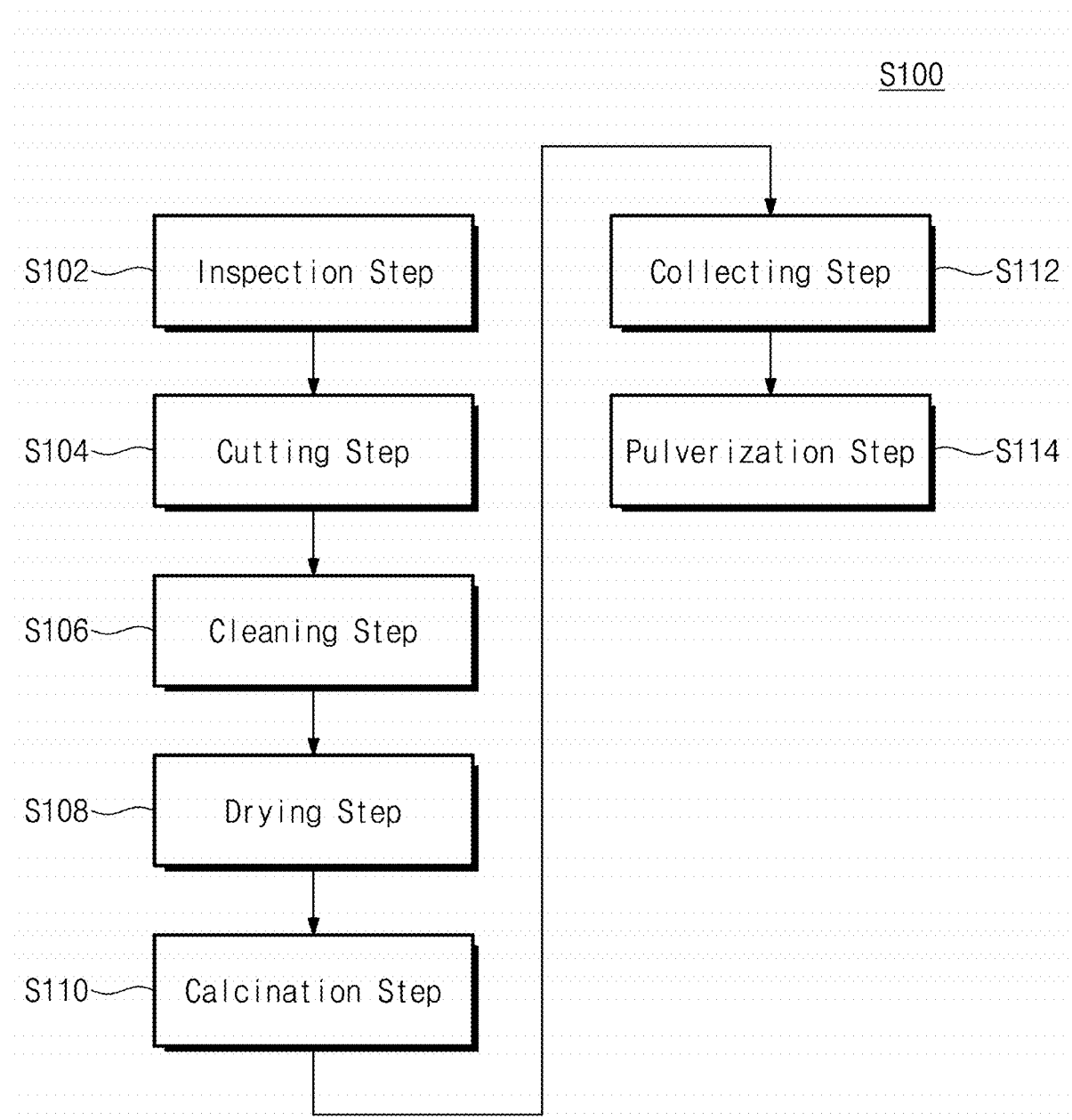
FIG. 2A is a flowchart for explaining an embodiment of a biological extracting process.

FIG. 2A is a flowchart for explaining an embodiment of the biological extracting process.

Referring FIG. 2A, the biological extracting process S100 according to FIG. 2A may be a dry process for extracting a biological material from a body tissue. For example, the body tissue may be at least one of a hair, a nail, and a toenail separated from a person or an animal.

The biological extracting process S100 according to FIG. 2A may include an inspection step S102, a cutting step S104, a cleaning step S106, a drying step S108, a calcination step S110, a collecting step S112, and a pulverization step S114.

The inspection step S102 may include inspecting a body tissue. The inspecting of the body tissue may include inspecting a weight of the body tissue by using an electronic scale and inspecting a state of the body tissue. For example, the body tissue may have a weight of about 10 g.

The cutting step S104 may include cutting the body tissue by using scissors. For example, the body tissue may be cut to have a length of about 0.5 cm to about 1 cm.

The cleaning step S106 may include cleaning the cut body tissue. The cleaning of the cut body tissue may include: putting the body tissue into a first beaker; pouring a cleaning solution into the first beaker; and cleaning the body tissue with the cleaning solution. The cleaning solution may include Alconox and distilled water. The Alconox may be one of cleaning agents manufactured by Alconox, Inc., which is an American corporation. For example, the cleaning of the body tissue with the cleaning solution may include cleaning the body tissue by using a stirrer and a stirring bar. The stirrer may be a magnetic stirrer. The stirring bar may be a magnetic stirring bar. The stirring bar may be provided in the first beaker, in which the body tissue and the cleaning solution are filled, and rotate by a magnetic field generated by the stirrer.

The cleaning step S106 may further include cleaning the cleaning solution from the body tissue. The cleaning of the cleaning solution from the body tissue may include: filtering the body tissue from the cleaning solution by using a first mesh net; putting the filtered body tissue into a second beaker; pouring distilled water into the second beaker; and cleaning the body tissue with the distilled water.

The drying step S108 may include: filtering the body tissue from the distilled water by using a second mesh net; and drying the filtered body tissue. The drying of the body tissue may include drying the body tissue by using an oven.

The calcination step S110 may include: combusting the body tissue by using an ashing furnace; and deodorizing smell generated due to the combustion by using a deodorizer. The combusting of the body tissue by using the ashing furnace may include: disposing a ceramic container storing the body tissue in the ashing furnace; allowing air to flow into the ashing furnace by using an air pump; primarily combusting the body tissue; and secondarily combusting the body tissue. The primarily combusting of the body tissue may include raising a temperature of the ashing furnace for a predetermined time and then maintaining the raised temperature for a predetermined time. The secondarily combusting of the body tissue may include raising the temperature of the ashing furnace, which is maintained in the primary combustion, for a predetermined time and then maintaining the raised temperature for a predetermined time. As the primary and secondary combustions are performed, an organic material in the body tissue may be removed while the body tissue in the ashing furnace is combusted, and the body tissue from which the organic material is removed may be defined as a biological material. As the body tissue is primarily and secondarily combusted, a total combustion time may be shortened, and the body tissue may not be carbonized. For example, the biological material may include at least one selected from the group consisting of Al, B, Ba, Ca, Cr, Cu, Fe, K, Li Mg, Mn, Na, Ni, Sr, Ti, V, Zn, Si, P, and S.

The biological material produced in the calcination step S110 may have a weight less than that of the body tissue before the calcination step S110. As air is flown into the ashing furnace, the body tissue in the ashing furnace may be completely combusted. In other words, the body tissue in the ashing furnace may not be carbonized. The organic material removed from the body tissue may move to the deodorizer connected to the ashing furnace and then discharged.

The collecting step S112 may include withdrawing the biological material in the ashing furnace after the primary and secondary combustions are finished.

In the pulverization step S114, the biological material may be minutely pulverized. The biological material may be minutely pulverized by using a mortar and a pestle.

Figure 2B:
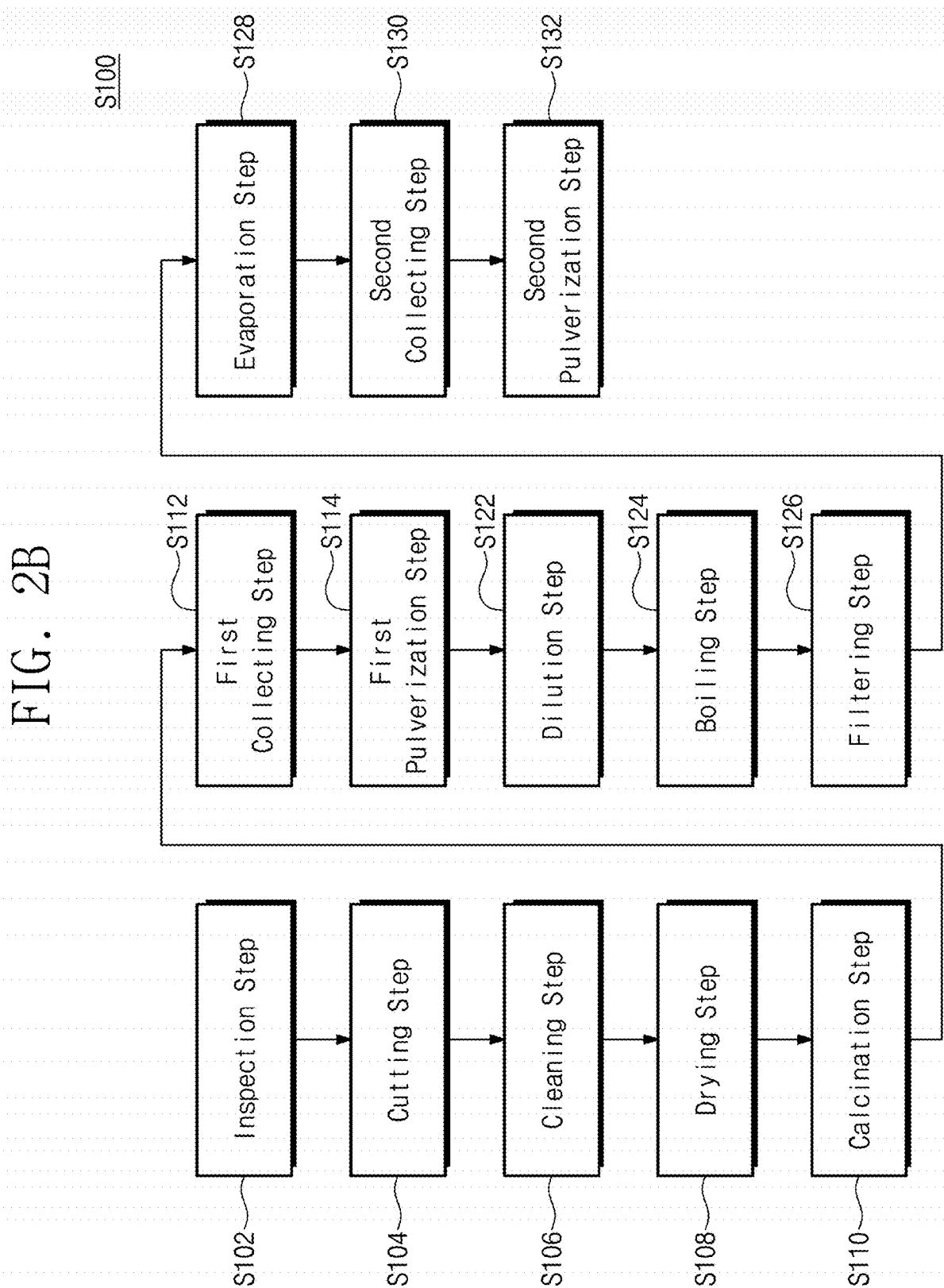
FIG. 2B is a flowchart for explaining an embodiment of the biological extracting process.

FIG. 2B is a flowchart for explaining an embodiment of the biological extracting process.

Referring to FIG. 2B, the biological extracting process S100 according to FIG. 2B may be a wet process for extracting a biological extract from a body tissue. For example, the body tissue may be one of a hair, a nail, and a toenail separated from a person.

The biological extracting process S100 according to FIG. 2B may include an inspection step S102, a cutting step S104, a cleaning step S106, a drying step S108, a calcination step S110, a first collecting step S112, a first pulverization step S114, a dilution step S122, a boiling step S124, a filtering step S126, an evaporation step S128, a second collecting step S130, and a second pulverization step S132.

The inspection step S102, the cutting step S104, the cleaning step S106, the drying step S108, the calcination step S110, the first collecting step S112, and the first pulverization step S114 of the biological extracting process S100 according to FIG. 2B may be substantially the same as the inspection step S102, the cutting step S104, the cleaning step S106, the drying step S108, the calcination step S110, the collecting step S112, and the pulverization step S114 of the biological extracting process S100 according to FIG. 2A.

In the dilution step S122, a diluted solution may be prepared by putting the biological material, which is pulverized in the first pulverization step S114, into distilled water.

In the boiling step S124, the diluted solution may be boiled while being stirred. The boiling of the diluted solution while being stirred may include:

stirring the diluted solution by using a magnetic stirrer and a magnetic stirring bar; and boiling the diluted solution by using a hot plate on the magnetic stirrer.

As the diluted solution is boiled while being stirred, the biological material may be separated into a biological extract and sludge. A material extracted from the biological material may be defined as the biological extract, and a material remained in the biological material may be defined as the sludge. The sludge may be precipitated in the diluted solution without being dissolved.

In the filtering step S126, the sludge in the diluted solution may be removed. The sludge in the diluted solution may be removed by using a centrifuge.

In the evaporation step S128, moisture in the diluted solution may be completely evaporated. The evaporating of the moisture in the diluted solution may include: putting the diluted solution and a gemstone material in a third beaker; placing the third beaker on the hot plate; and boiling the diluted solution by heating the diluted solution with the hot plate. The gemstone material may be relatively smaller in amount than a gemstone material, which will be added in the mixed material preparing process S200. For example, the gemstone material may include at least one of aluminum oxide and silicon magnesium oxide.

As the moisture of the diluted solution is completely evaporated, the biological extract and the gemstone material may be gotten in the third beaker. The biological extract and the gemstone material may be gotten while being attached to a sidewall and a bottom surface of the third beaker. For example, the biological extract may include at least one selected from the group consisting of Al, B, Ba, Ca, Cr, Cu, Fe, K, Li Mg, Mn, Na, Ni, Sr, Ti, V, Zn, Si, P, and S.

In the second collecting step S130, the biological extract and the gemstone material, which are attached to the sidewall and the bottom surface of the third beaker, may be collected. For example, the biological extract and the gemstone material may be collected by scraping the biological extract and the gemstone material, which are attached to the sidewall and the bottom surface of the third beaker. As the gemstone material is put into the third beaker in the evaporation step S128, an amount of a gotten material (a sum of the biological extract and the gemstone material) may increase, and the biological extract may be relatively easily collected.

In the second pulverization step S132, the collected biological extract and gemstone material may be minutely pulverized. The biological extract and the gemstone material may be minutely pulverized by using a mortar and a pestle.

Figure 2C:
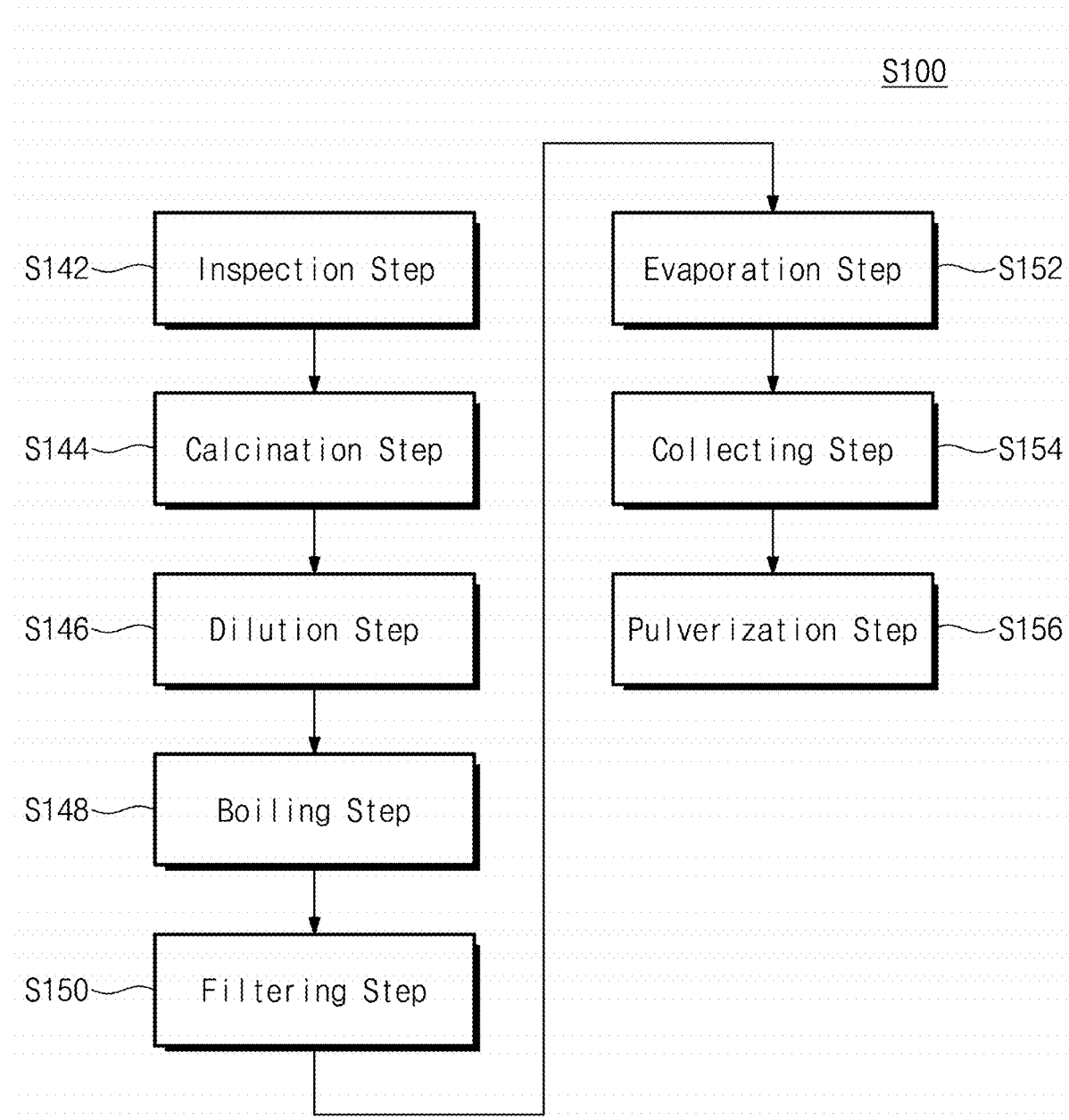
FIG. 2C is a flowchart for explaining an embodiment of the biological extracting process.

FIG. 2C is a flowchart for explaining an embodiment of the biological extracting process.

Referring to FIG. 2C, the biological extracting process S100 according to FIG. 2C may be a wet process for extracting a biological extract from cremation ashes.

The extracting process S100 according to FIG. 2C may include an inspection step S142, a calcination step S144, a dilution step S146, a boiling step S148, a filtering step S150, an evaporation step S152, a collecting step S154, and a pulverization step S156.

The inspection step S142 may include inspecting cremation ashes. For example, the cremation ash may have a weight of about 50 g.

In the calcination step S144, the cremation ashes may be heated. The cremation ashes may be heated in a furnace. Through the calcination step S144, foreign substances in the cremation ashes may be removed, and the cremation ashes may have a homogeneous state.

In the dilution step S146, a dilution solution may be prepared by putting the cremation ashes and distilled water into a beaker.

The boiling step S148 may include stirring the diluted solution and boiling the diluted solution. The stirring of the diluted solution may include stirring the diluted solution by using a stirrer. The stirrer may include a stirring bar and an electric motor that moves the stirring bar. The boiling of the diluted solution may include boiling the diluted solution by using a hot plate. Before the boiling of the diluted solution by using the hot plate, when the diluted solution is heated by an additional process, a time for boiling the diluted solution by using the hot plate may be shortened.

As the diluted solution is boiled while being stirred, the cremation ashes may be separated into a biological extract and sludge. A material extracted from the cremation ashes may be defined as the biological extract, and a material remained in the cremation ashes may be defined as the sludge. The sludge may be precipitated in the diluted solution without being dissolved.

In the filtering step S150, the sludge in the diluted solution may be removed. The sludge in the diluted solution may be removed by using a centrifuge.

In the evaporation step S152, moisture in the diluted solution may be completely evaporated. The evaporating of the moisture in the diluted solution may include: putting the diluted solution and a gemstone material in a beaker; placing the beaker on the hot plate; and boiling the diluted solution by heating the diluted solution with the hot plate. The gemstone material may be relatively smaller in amount than the gemstone material, which will be added in the mixed material preparing process S200. For example, the gemstone material may include at least one of aluminum oxide and silicon magnesium oxide.

As the moisture of the diluted solution is completely evaporated, the biological extract and the gemstone material may be gotten in the beaker. The biological extract and the gemstone material may be gotten while being attached to a sidewall and a bottom surface of the beaker. For example, the biological extract may include at least one selected from the group consisting of Al, B, Ba, Ca, Cr, Cu, Fe, K, Li Mg, Mn, Na, Ni, Sr, Ti, V, Zn, Si, P, and S.

In the collecting step S154, the biological extract and the gemstone material, which are attached to the sidewall and the bottom surface of the beaker, may be collected. As the gemstone material is put into the beaker in the evaporation step S152, an amount of a gotten material (a sum of the biological extract and the gemstone material) may increase, and the biological extract may be relatively easily collected.

In the pulverization step S156, the collected biological extract and gemstone material may be minutely pulverized. The biological extract and gemstone material may be minutely pulverized by using a mortar and a pestle.

Figure 3:
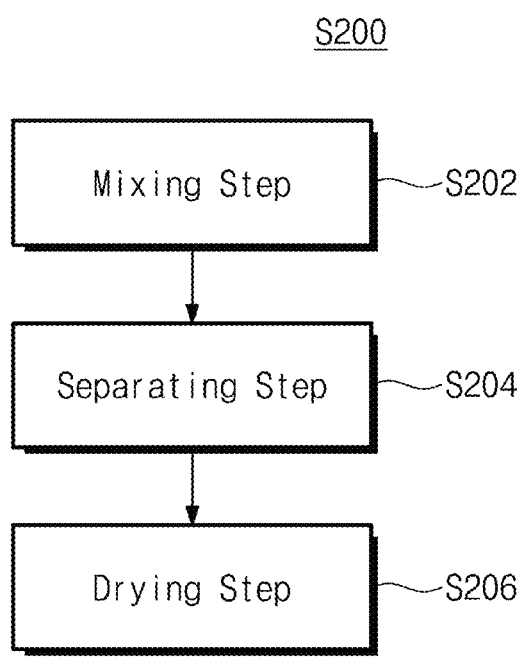
FIG. 3 is a flowchart for explaining an embodiment of a mixed material preparing process.

FIG. 3 is a flowchart for explaining an embodiment of the mixed material preparing process.

Referring to FIG. 3, the mixed material preparing process S200 may include a mixing step S202, a separating step S204, and a drying step S206.

In the mixing step S202, a gemstone material may be added to the biological material or the biological extract and the gemstone material, which are pulverized in the biological extracting process S100. A mixed material may be prepared by mixing the biological material or the biological extract and the gemstone material with the added gemstone material. When the biological material, which is extracted in the biological extracting process S100 according to FIG. 2A, is used, a content ratio of the biological material in the mixed material may be about 0.01 wt % to about 0.1 wt %. When the biological extract, which is extracted in the biological extracting process S100 according to FIG. 2B, is used, a content ratio of the biological extract in the mixed material may be about 0.01 wt % to about 0.1 wt %. When the biological extract, which is extracted in the biological extracting process S100 according to FIG. 2C, is used, a content ratio of the biological extract in the mixed material may be about 0.1 wt % to about 0.5 wt %.

The mixing of the biological material or the biological extract and the gemstone material with the added gemstone material may include: putting the biological material or the biological extract, the gemstone material, the added gemstone material, and ceramic balls into a mixer; and operating the mixer for about one hour. When the ceramic balls are put into the mixer, the mixed material may have a relatively high homogeneity. For example, the ceramic balls may be zirconium balls. For example, the mixer may be a double shaking mixer.

In the separating step S204, the mixed material and the ceramic balls may be separated from each other. the mixed material and the ceramic balls may be separated by using a third mesh net.

In the drying step S206, the mixed material may be dried. The drying of the mixed material may include drying the mixed material by using an oven.

Due to the biological extracting process S100 and the mixed material preparing process S200 according to an embodiment of the inventive concept (particularly, the content ratio of the biological material or the biological extract), without putting the biological material or the biological extract while heating the gemstone material as a high temperature (e.g., about 1600° C.), a synthetic gemstone, which is grown in the following gemstone growing process S300, may have a clear tone without cracks. For example, the heating of the gemstone material at a high temperature may include forming a gamma-phase aluminum oxide ($\gamma$-$AL_2O_3$) by heating ammonium sulfate ($AL_2(NH_4)_2(SO_4)_4 \cdot 24H_2O$).

Figure 4:
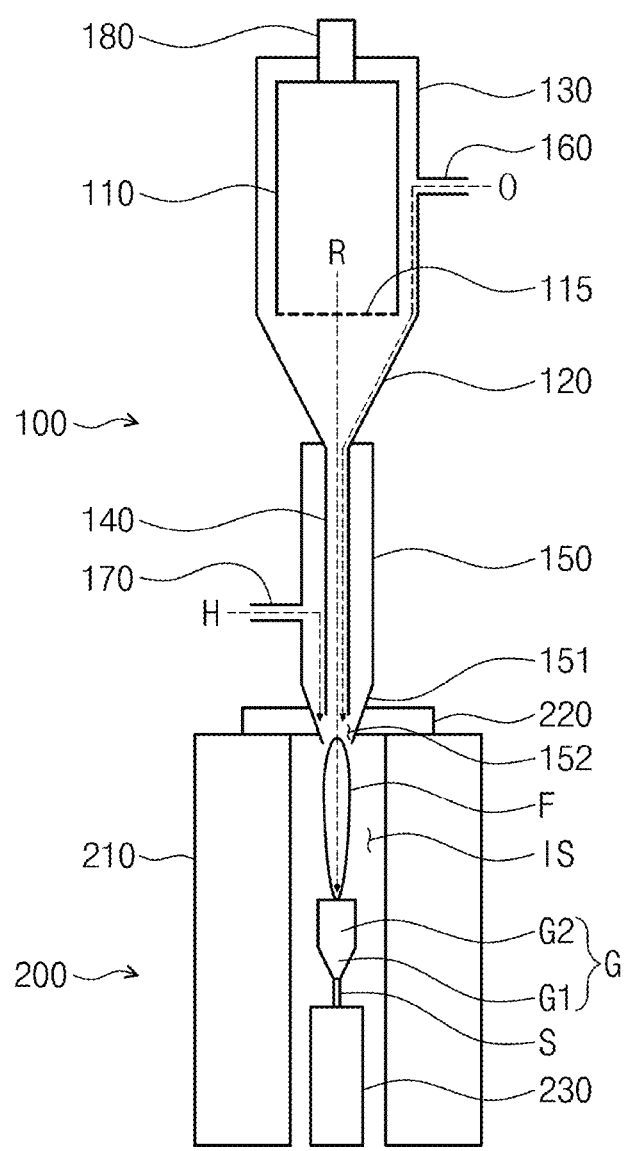
FIG. 4 is a cross-sectional view for explaining a gemstone growing device.
Figure 5:
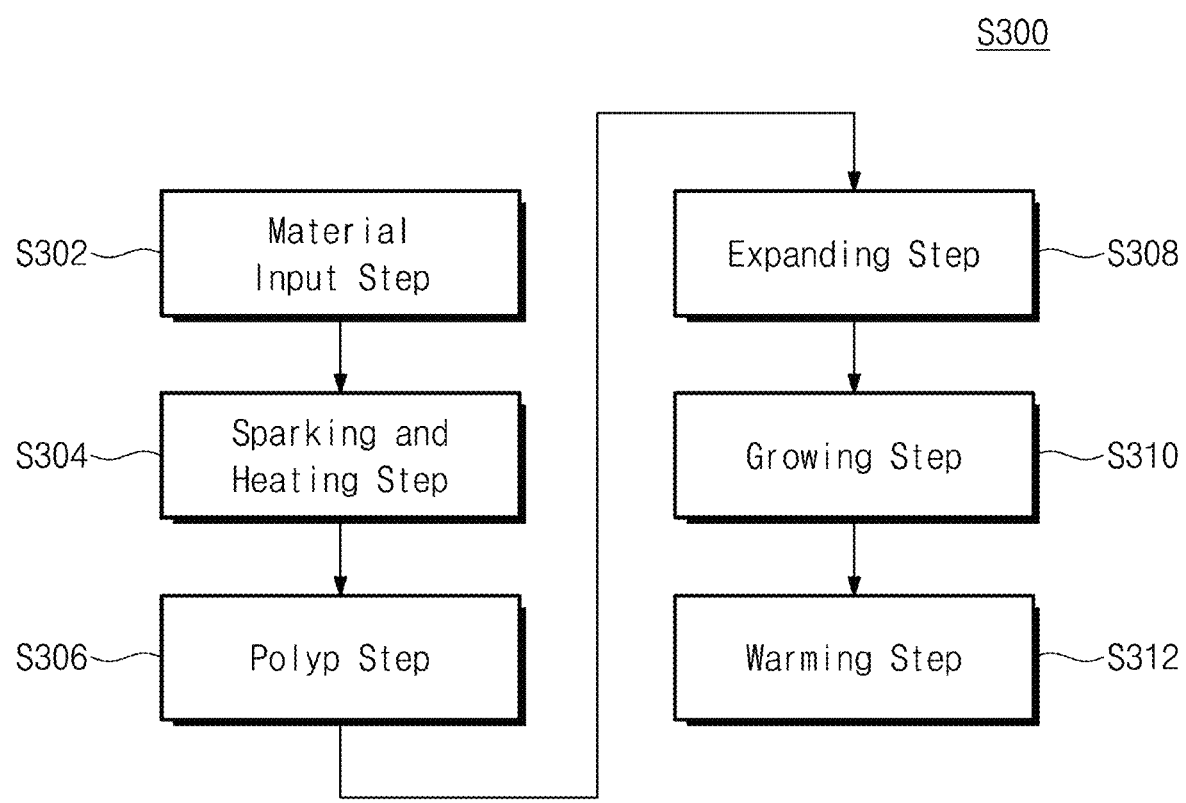
FIG. 5 is a flowchart for explaining an embodiment of a gemstone growing process.

FIG. 4 is a cross-sectional view for explaining a gemstone growing device. FIG. 5 is a flowchart for explaining an embodiment of the gemstone growing process.

Referring to FIG. 4, the gemstone growing device may include a material input unit 100 and a gemstone growing unit 200.

The material input unit 100 may include a mixed material input part 110, a mesh net 115, a hopper 120, a first pipe 130, a second pipe 140, a third pipe 150, an oxygen input pipe 160, a hydrogen input pipe 170, and a tapping part 180.

The first pipe 130 may be connected to the hopper 120. The mixed material input part 110 may be provided in the first pipe 130. A mixed material R may be inputted into the mixed material input part 110. The mesh net 115 may be provided between the mixed material input part 110 and the hopper 120. The mixed material R in the mixed material input part 110 may move to the hopper 120 through the mesh net 115. The tapping part 180 may be provided on the mixed material input part 110. The tapping part 180 may apply a physical force to the mixed material input part 110. The mixed material R in the mixed material input part 110 may move to the hopper 120 through the mesh net 115 by the physical force applied by the tapping part 180.

The oxygen input pipe 160 may be connected to a sidewall of the first pipe 130. Oxygen O may be inputted to the first pipe 130 through the oxygen input pipe 160. The oxygen O may move to the hopper 120 through the first pipe 130.

The hopper 120 may have a funnel shape. The hopper 120 may be connected to the second pipe 140. The mixed material R and oxygen O in the hopper 120 may move to the second pipe 140. In the hopper 120 and the second pipe 140, the oxygen O may act as a carrying gas of the mixed material R. In other words, the mixed material R may move by the movement of the oxygen O.

The third pipe 150 surrounding the second pipe 140 may be provided. In other words, the second pipe 140 may be provided in the third pipe 150. The hydrogen input pipe 170 may be connected to a sidewall of the third pipe 150. Hydrogen H may be inputted to the third pipe 150 through the hydrogen input pipe 170.

The third pipe 150 may include an end 151 connected to the gemstone growing unit 200. An opening 152 may be provided in the end 151 of the third pipe 150. The hydrogen H and the oxygen O may be discharged through the opening 152 of the third pipe 150. The mixed material R may be discharged through the opening 152 of the third pipe 150.

A spark plug (not shown) may be provided adjacent to the opening 152 of the third pipe 150. A flame F, which uses the hydrogen H and the oxygen O as a fuel, may be formed by a spark of the spark plug.

The gemstone growing unit 200 may include a muffle 210, a sealing part 220, and a support 230.

The muffle 210 may have an inner space IS therein. The inner space IS of the muffle 210 may communicate the inside of the third pipe 150 through the opening 152 of the third pipe 150.

The sealing part 220 may be provided between an outer wall of the end 151 of the third pipe 150 and the muffle 210. The sealing part 220 may fix the third pipe 150. The sealing part 220 may seal the inner space IS of the muffle 210 so that the inner space IS of the muffle 210 is not in communication with an external space above the muffle 210.

The support 230, which is movable upward and downward, may be provided. The support 230 may move into the inner space IS of the muffle 210 from the external space below the muffle 210 when move upward and move to the external space below the muffle 210 from the inner space IS of the muffle 210 when move downward. A crystal seed S may be provided on the support 230. The crystal seed S may be a seed of the synthetic gemstone G to be grown.

The flame F may be formed in the inner space IS of the muffle 210 by the hydrogen H and the oxygen O. The mixed material R, which moves to the inner space IS of the muffle 210 through the opening 152 of the third pipe 150, may be melted by the flame F.

Referring to FIGS. 4 and 5, the gemstone growing process S300 may include a material input step S302, a sparking and heating step S304, a melting step S306, an expanding step S308, a growing step S310, and a warming step S312.

In the material input step S302, a material may be inputted to the material input unit 100. The mixed material R may be inputted to the mixed material input part 110, the oxygen O may be inputted to the oxygen input pipe 160, and the hydrogen H may be inputted to the hydrogen input pipe 170.

The oxygen O may move along the first pipe 130, the hopper 120, and the second pipe 140 and be discharged through the opening 152 of the third pipe 150. The hydrogen H may move along the third pipe 150 and be discharged through the opening 152 of the third pipe 150.

In the sparking and heating step S304, the flame F may be formed. The flame F may be formed by sparking, by the spark plug, the hydrogen H and the oxygen O, which are discharged through the opening 152 of the third pipe 150. The flame F may be formed in the inner space IS of the muffle 210. The inner space IS of the muffle 210 may increase in temperature by the flame F formed therein.

In the melting step S306, the crystal seed S may be provided on the support 230. Thereafter, the support 230 ascends so that an uppermost portion of the crystal seed S contacts the flame F. While the uppermost portion of the crystal seed S contacts the flame F, the uppermost portion of the crystal seed S may be melted. The melted uppermost portion of the crystal seed S may have a diameter greater than that of the uppermost portion of the crystal seed S before melted.

In the expanding step S308, a first portion G1 of the synthetic gemstone G may be grown on the crystal seed S. When the tapping part 180 applies a physical force to the mixed material input part 110, the mixed material R in the mixed material input part 110 may pass through the mesh net 115 and move to the hopper 120. The mixed material R may move along the hopper 120, and the second pipe 140, and be discharged through the opening 152 of the third pipe 150. The mixed material R, which is discharged through the opening 152 of the third pipe 150, may be melted by the flame F. As the mixed material R, which is melted by the flame F, is arrived on the melted uppermost portion of the crystal seed S, the first portion G1 of the synthetic gemstone G may be grown.

The first portion G1 of the synthetic gemstone G may increase in diameter while being grown. As an amount of the oxygen O gradually increases through the oxygen input pipe 160, the first portion G1 of the synthetic gemstone G may increase in diameter while being grown. As the first portion G1 of the synthetic gemstone G is grown, the support 230 may descend. As the support 230 descends, the first portion G1 of the synthetic gemstone G may be grown to maintain a state in which the uppermost portion of the first portion G1 of the synthetic gemstone G contacts the flame F. In other words, the support 230 may descend as the synthetic gemstone is grown.

In the growing step S310, a second portion of the synthetic gemstone G may be grown on the first portion G1 of the synthetic gemstone G. The second portion G2 of the synthetic gemstone G may be grown to maintain a diameter thereof. As an amount of the oxygen O supplied through the oxygen input pipe 160 is constantly maintained, the second portion G2 of the synthetic gemstone G may be grown to maintain the diameter thereof. As the second portion G2 of the synthetic gemstone G is grown, the support 230 may descend. As the support 230 descends, the second portion G2 of the synthetic gemstone G may be grown to maintain a state in which the uppermost portion of the second portion G2 of the synthetic gemstone G contacts the flame F.

In the warming step S312, when the growth of the synthetic gemstone G is completed, the flame F may be distinguished by stopping the supply of the oxygen O and the hydrogen H. Although the flame F is distinguished, the inner space IS of the muffle 210 may be maintained at a relatively high temperature for a predetermined time. The synthetic gemstone G may be withdrawn at a relatively slow speed from the inner space IS of the muffle 210 by allowing the support 230 to descend. As the synthetic gemstone G is withdrawn at a relatively slow speed from the inner space IS of the muffle 210, an internal stress of the synthetic gemstone G may be reduced.

The method for manufacturing the synthetic gemstone according to the embodiment of the inventive step may manufacture the synthetic gemstone having a specific color according to characteristics and element contents of the biological material or the biological extract by extracting the biological material or the biological extract from the body tissue separated from a person or an animal or from the cremation ashes of a corpse of a person or an animal through the wet or dry process.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a synthetic gemstone, which manufactures a synthetic gemstone from at least one of a hair, a fingernail, and a toenail separated from a person or an animal, the method comprising:
    extracting a biological material from at least one of the hair, the fingernail, and the toenail;
    preparing a mixed material by mixing the biological material with a gemstone material; and
    growing a synthetic gemstone on a crystal seed as a single crystal by melting the mixed material,
    wherein the extracting of the biological material from at least one of the hair, the fingernail, and the toenail comprises:
    disposing at least one of the hair, the fingernail, and the toenail in a furnace; and
    removing an organic material in at least one of the hair, the fingernail, and the toenail by completely combusting at least one of the hair, the fingernail, and the toenail while allowing air to flow into the furnace,
    wherein the gemstone material comprises at least one of an aluminum oxide and a silicon magnesium oxide,
    wherein the growing of the synthetic gemstone as a single crystal includes,
        a material input step of inputting the mixed material to a material input unit;
        a sparking and heating step of sparking a flame by using oxygen and hydrogen and raising a temperature of an inner space of a muffle by the flame;
        a melting step of melting an uppermost portion of the crystal seed;
        an expanding step of growing a first portion of the synthetic gemstone by allowing the melted mixed material to be arrived on the crystal seed;
        a growing step of growing a second portion of the synthetic gemstone by allowing the melted mixed material to be arrived on the first portion; and
        a warming step of reducing an internal stress of the synthetic gemstone,
    wherein while the first portion is grown, a diameter thereof increases, and while the second portion is grown, a diameter thereof is maintained to be constant.

2. The method of claim 1, wherein the extracting of the biological material from at least one of the hair, the fingernail, and the toenail further comprises cleaning at least one of the hair, the fingernail, and the toenail by using a cleaning solution.

3. A method for manufacturing a synthetic gemstone, which manufactures a synthetic gemstone from at least one of a hair, a fingernail, and a toenail separated from a person or an animal, the method comprising:
    extracting a biological extract from at least one of the hair, the fingernail, and the toenail;
    preparing a mixed material by mixing the biological extract with a gemstone material; and
    forming a synthetic gemstone on a crystal seed as a single crystal by melting the mixed material,
    wherein the extracting of the biological extract from at least one of the hair, the fingernail, and the toenail comprises:
    extracting a biological material from at least one of the hair, the fingernail, and the toenail;
    putting the biological material into distilled water;
    boiling the distilled water to separate the biological material into the biological extract and a sludge;
    removing the sludge in the distilled water; and
    extracting the biological extract from the distilled water,
    wherein the gemstone material is at least one of an aluminum oxide and a silicon magnesium oxide, and the sludge is not dissolved in the distilled water.

4. The method of claim 3, wherein the extracting of the biological extract further comprises:
    putting the gemstone material into the distilled water; and
    evaporating moisture in the distilled water.

5. A method for manufacturing a synthetic gemstone, which manufactures a synthetic gemstone from cremation ashes of a corpse of a person or an animal, the method comprising:
    extracting a biological extract from the cremation ashes;
    preparing a mixed material by mixing the biological extract with a gemstone material; and
    forming a synthetic gemstone on a crystal seed as a single crystal by melting the mixed material,
    wherein the extracting of the biological extract from the cremation ashes comprises:
    removing foreign substances in the cremation ashes by heating the cremation ashes in a furnace;
    putting the cremation ashes into distilled water;
    boiling the distilled water to separate the cremation ashes into the biological extract and a sludge;
    removing the sludge in the distilled water; and
    extracting the biological extract from the distilled water,
    wherein the gemstone material is at least one of an aluminum oxide and a silicon magnesium oxide, and the sludge is not dissolved in the distilled water.

6. The method of claim 5, wherein the extracting of the biological extract from the distilled water comprises:
    putting the gemstone material into the distilled water; and
    evaporating the distilled water.

7. The method of claim 5, wherein the extracting of the biological extract further comprises stirring a diluted solution by using a stirrer comprising a stirring bar and an electric motor configured to move the stirring bar.

8. The method of claim 1, wherein the preparing of the mixed material comprises mixing the biological extract and the gemstone material by using a mixer.

9. The method of claim 8, wherein the mixing of the biological extract and the gemstone material by using the mixer comprises mixing the biological extract, the gemstone material, and a ceramic ball, and the mixer is a double shaking mixer.

* * * * *